US009318287B2

(12) United States Patent
Saito et al.

(10) Patent No.: US 9,318,287 B2
(45) Date of Patent: Apr. 19, 2016

(54) RELAY FIXING STRUCTURE

(71) Applicant: YAZAKI CORPORATION, Tokyo (JP)

(72) Inventors: Kazuaki Saito, Kakegawa (JP); Kazuyuki Kawashita, Kakegawa (JP); Masayo Kaneko, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 14/435,787

(22) PCT Filed: Oct. 31, 2013

(86) PCT No.: PCT/JP2013/079618
§ 371 (c)(1),
(2) Date: Apr. 15, 2015

(87) PCT Pub. No.: WO2014/069596
PCT Pub. Date: May 8, 2014

(65) Prior Publication Data

US 2015/0248980 A1 Sep. 3, 2015

(30) Foreign Application Priority Data

Nov. 1, 2012 (JP) ................................ 2012-242228

(51) Int. Cl.
*H01H 45/04* (2006.01)
*H01H 50/04* (2006.01)
*H05K 7/02* (2006.01)

(52) U.S. Cl.
CPC ............. *H01H 45/04* (2013.01); *H01H 50/048* (2013.01); *H05K 7/026* (2013.01); *H01H 2223/044* (2013.01)

(58) Field of Classification Search
CPC ..... H01H 45/04; H01H 71/02; H01H 71/326; H01H 73/06; H01H 50/048; H01H 2223/044; H05K 7/026
See application file for complete search history.

(56) References Cited

U.S. PATENT DOCUMENTS 7,500,856 B2 * 3/2009 Iizuka .................... H02G 3/081 439/76.2
2006/0154532 A1 7/2006 Yamada et al.

(Continued)

FOREIGN PATENT DOCUMENTS

JP UM-H04-043331 A 4/1992
JP 2002-354631 A 12/2002

(Continued)

OTHER PUBLICATIONS

International Search Report dated Dec. 10, 2013 for International application No. PCT/JP2013/079618.
International Preliminary Report on Patentability dated May 5, 2015, for International application No. PCT/JP2013/079618.

*Primary Examiner* — Mohamad Musleh
(74) *Attorney, Agent, or Firm* — Morgan, Lewis & Bockius LLP

(57) ABSTRACT

Rib portions (87) have first rib portions (87*a*) which abut against outer portions, and second rib portions (87*h*) which abut against wail portions. They are formed in plural numbers over the entire circumference of an edge portion (82). Pressing portions (88) are disposed on a lid portion (81) so as to be opposed to a relay (2), and, in a state where engaging portions (67) and engaged portions (84) are engaged with each other, elastically deformed to press the relay (2) toward a bottom portion (61).

2 Claims, 4 Drawing Sheets

(56) References Cited

U.S. PATENT DOCUMENTS

2007/0093090 A1* 4/2007 Fujimaki .............. H01H 50/043
439/76.2
2008/0149387 A1* 6/2008 Oda ....................... H05K 7/026
174/520

FOREIGN PATENT DOCUMENTS

JP 2004-080966 A 3/2004
JP 2005-86865 A 3/2005
JP 2006-288190 A 10/2006

* cited by examiner

RELAY FIXING STRUCTURE

TECHNICAL FIELD

The present invention relates to a structure for fixing a relay to a housing.

BACKGROUND ART

On a vehicle such as an automobile, usually, a relay for controlling connections between a power supply apparatus and loads (a battery assembly and an electric motor constitute an example of the relationships) is mounted. In an electric vehicle which travels by using an electric motor, a hybrid vehicle which travels by using both an engine and an electric motor, or the like, for example, a relay supplies an electric power to the electric motor through an inverter. The relay includes a main relay which connects and disconnects the output of a battery assembly that is to be supplied to the inverter. The main relay has a pair of relay terminals. One of the relay terminals is connected to the integrated positive electrode of the battery assembly through a circuit, and the other relay terminal is connected to the integrated negative electrode of the battery assembly through a circuit.

The relay is one of components of a junction box which is disposed between the battery assembly and the electric motor, and fixed to the housing of the junction box (see Patent Literature 1). In the configuration disclosed in Patent Literature 1, first regulating portions which regulate the horizontal movement of the relay, and second regulating portions which regulate the vertical movement are disposed in the housing. In the relay, a flange is formed over the entire circumference of the lower portion. According to the configuration, then the relay is to be fixed to the housing, the lower surface of the flange abuts against the first regulating portions, and the horizontal movement along the fixing surface is regulated. In this case, the flange abuts against engaging pieces formed on the second regulating portions to press tip end portions of the engaging pieces, thereby causing the engaging pieces to be elastically flexurally deformed. When the lower surface of the flange then abuts against the first regulating portions, the engaging pieces are elastically flexurally return deformed, and the tip end portions are engaged with the upper surface of the flange. As a result, the movement of the relay which is perpendicular to the fixing surface is regulated.

CITATION LIST

Patent Literature

Patent Literature 1: JP-A-2006-288190

SUMMARY OF INVENTION

Technical Problem

In the configuration disclosed in Patent Literature 1, as described above, the first regulating portions and the second regulating portions are disposed on the housing, thereby enabling the relay to be fixed to the housing while regulating the horizontal and vertical movements of the relay. In the configuration, when the relay is to be fixed to the housing, however, the relay must be pressingly inserted until abuting against the first regulating portions, while the relay is pressed against the second regulating portions to elastically flexurally deform the second regulating portions. Therefore, the assembly property is low. Moreover, only the lower portion (the position where the flange is formed) of the relay is held by the first regulating portions and the second regulating portions. In the case where the center of gravity is in the upper part of the relay, there is a possibility that shaking or rattling of the relay due to vibration of the vehicle cannot be suppressed.

The invention has been conducted in view of the above. A problem to be solved by the invention is to realize a relay fixing structure which can be easily assembled to a housing, and which can regulate movements in all of the upper, lower, front, rear, right, and left directions.

Solution to Problem

In order to solve the problem, as one aspect of the invention, a relay fixing structure for fixing a relay which controls on/off states of an electric circuit, to a housing includes:

a housing base including a bottom portion on which the relay is to be placed, and a wall portions which surrounds an outer portion of the relay and erects from the bottom portion; and a housing cover including a lid portion which covers the relay, and an edge portion which is suspended from a peripheral edge of the lid portion toward the wall portion of the housing base, wherein the housing base is provided with an engaging portion which is engaged with the housing cover, the housing cover is provided with an engaged portion which is configured to be engaged with the engaging portion, a rib portion which regulates movement of the relay, and a pressing portion which presses the relay and is elastically deformable, the rib portion includes first rib portions which abut against the outer portion, and second rib portions which abut against the wall portion, the first rib portions and the second rib portions are formed in plural numbers over an entire circumference of the edge portion, and the pressing portion is disposed on the lid portion so as to be opposed to the relay, and is elastically deformed to press the relay toward the bottom portion in a state where the engaging portion and the engaged portion are engaged with each other.

According to the configuration, the relay can be easily assembled to the housing, simply by setting the relay in the state where the relay is placed on the bottom portion of the housing base (base plate) and accommodated in the wall portions, and assembling the cover which covers the relay in the state, to the housing base. In this assembled state, movements of the relay in all of the upper, lower, front, rear, right, and left directions (namely, the horizontal and vertical directions) of the housing can be regulated.

In another aspect of the invention, a relay fixing structure is provided in which the relay includes a flange which is formed over an entire circumference by being projected from the outer portion located on a side of the bottom portion in a case where the relay is placed on the bottom portion, and the flange interferes with the wall portion in a state where the relay is placed on the bottom portion.

According to the configuration, the relay has the configuration having the flange which is formed over the entire circumference by being projected from the outer portions that are located on the side of the placement on the bottom portion, and the flange is caused to interfere with the wall portions in the state where the relay is placed on the bottom portion. In the vicinity of the place where the flange is disposed on the relay, i.e., on the side of the bottom portion in the case where the relay is placed on the bottom portion, therefore, the horizontal movement of the relay can be effectively regulated.

Advantageous Effects of Invention

According to the invention, a relay can be easily assembled to a housing, and movements of the relay in all of the upper, lower, front, rear, right, and left directions can be regulated.

DESCRIPTION OF EMBODIMENTS

Hereinafter, the relay fixing structure of the invention will be described in detail with reference to the accompanying drawings. The relay fixing structure of the invention is a structure for fixing a relay which controls the on/off states of an electric circuit, to a housing. The relay is disposed between a power supply and a load which is connected to the power supply, and controls the electrical connection between the power supply and the load. An example of the power supply is a power supply apparatus (batteries) that is mounted on an electric vehicle which travels by using an electric motor, a hybrid vehicle which travels by using both an engine and an electric motor, or the like, and that supplies an electric power to the electric motor. An example of the load is the electric motor that is powered by the power supply apparatus. The combination of the power supply and load the connection of which is controlled by the relay in the invention is not particularly limited to these combinations.

The power supply apparatus includes a battery assembly in which a plurality of secondary batteries are connected in series, a pair of end plates which clampingly hold the battery assembly between them, and a junction box which is placed between the battery assembly and the electric motor. The junction box may have a configuration including a relay and circuit which control the on/off states of the connection between the battery assembly and the electric motor. In this case, for example, the relay may be held by an upper cover (corresponding to a housing which will be described later), the circuit may be held by a lower cover, and the upper cover and the lower cover may be assembled together, thereby configuring the junction box.

Figure 1:
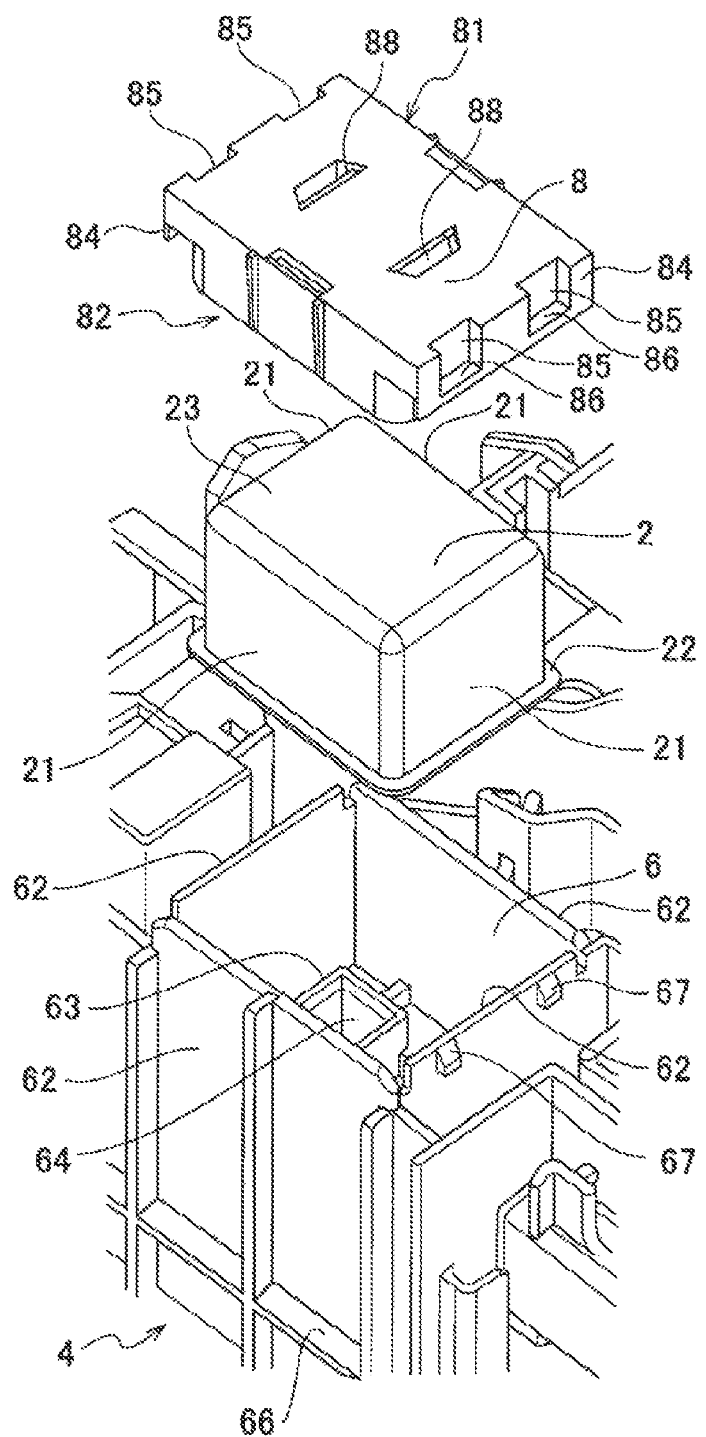
FIG. 1 is an exploded perspective view of a relay fixing structure of an embodiment of the invention.
Figure 2:
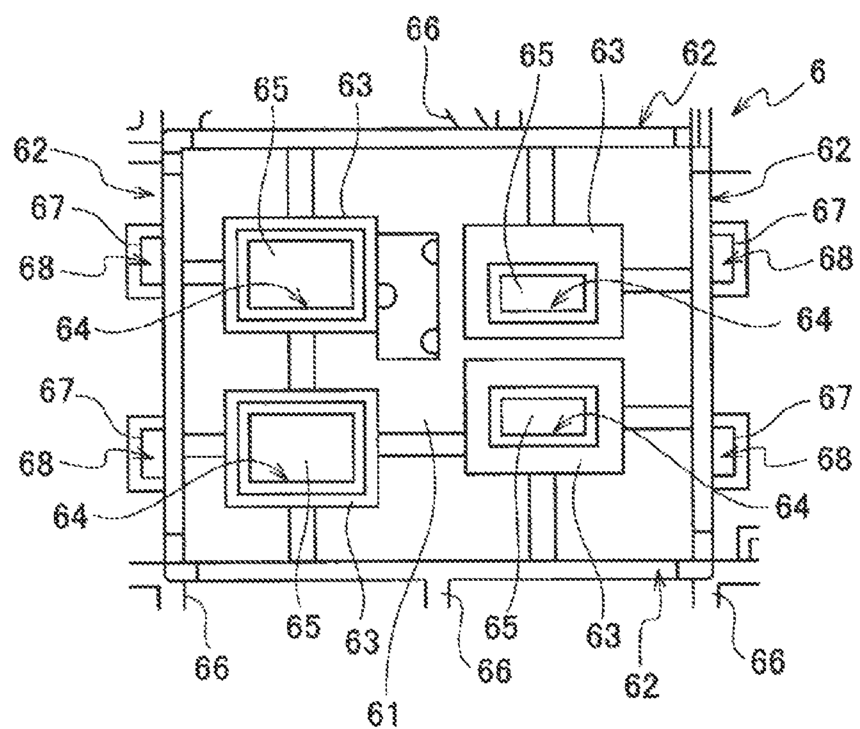
FIG. 2 is a plan view showing a state where a relay has not yet been placed on a housing base (base plate).
Figure 3:
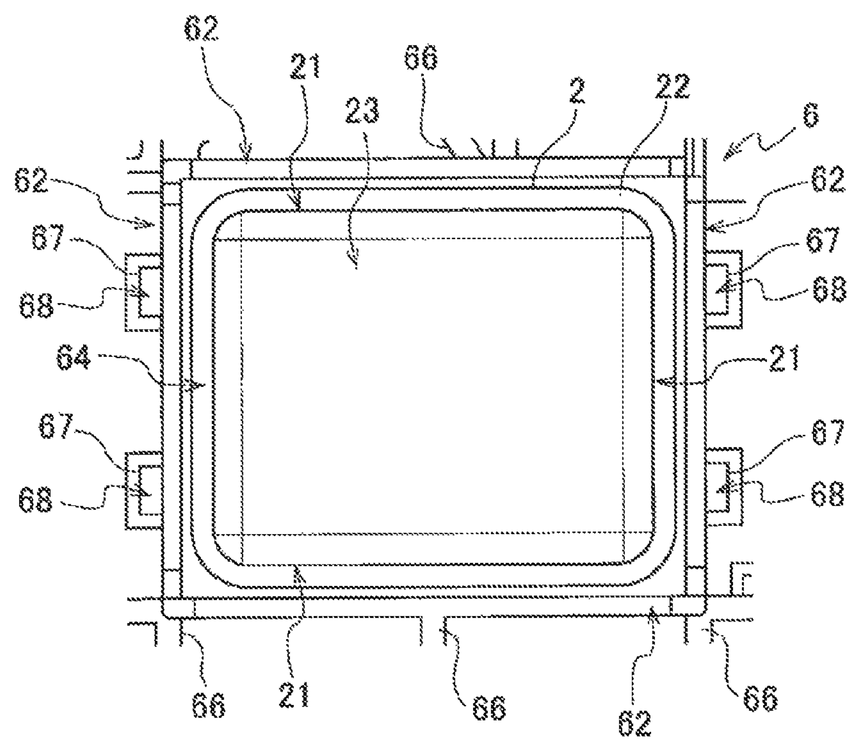
FIG. 3 is a plan view showing a state where the relay has been placed on the housing base.
Figure 4:
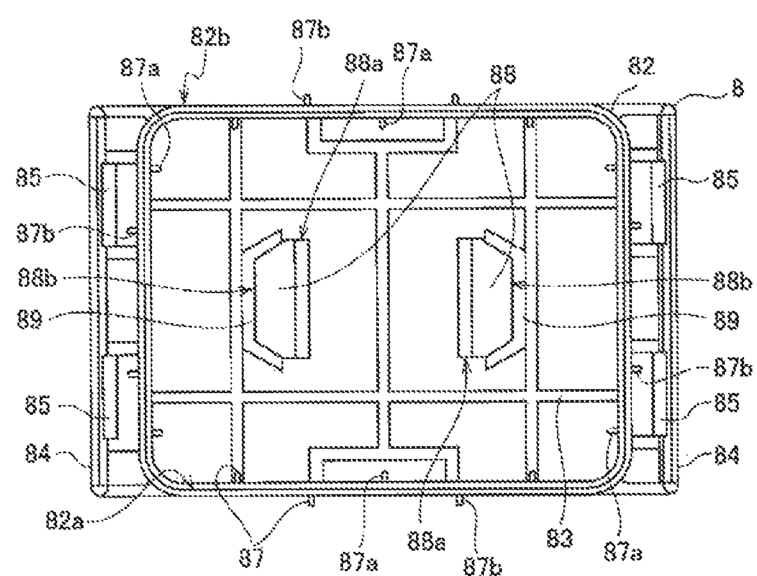
FIG. 4 is a plan view of the inner side of a housing cover.

FIGS. 1 to 4 show the whole configuration of the relay fixing structure of the embodiment of the invention. FIG. 1 is an exploded perspective view of the relay fixing structure of the embodiment of the invention, FIG. 2 is a plan view showing a state where the relay has not yet been placed on the housing base which will be described later, FIG. 3 is a plan view showing a state where the relay has been placed on the housing base, and FIG. 4 is a plan view of the inner side of the housing cover which will be described later.

In the embodiment, the relay 2 supplies an electric power to the electric motor (not shown) through an inverter, and includes a main relay which connects and disconnects the output of a battery assembly (not shown) that is to be supplied to the inverter. The main relay has a pair of relay terminals. One of the relay terminals is connected to the integrated positive electrode of the battery assembly through a circuit, and the other relay terminal is connected to the integrated negative electrode of the battery assembly through a circuit. According to the configuration, the relay 2 controls the electrical connection between the battery assembly and the electric motor by connecting or disconnecting the electrical output from the battery assembly to the electric motor. FIG. 1 shows an example of the configuration of the relay 2 in which the whole external shape is formed into a substantially rectangular parallelepiped shape. The relay 2 has a flange 22 which is formed over the entire circumference by being projected from outer portions 21 that are located on the side of the bottom portion 61 (the lower side in FIG. 1) in the case where the relay is placed on the bottom portion 61 of the housing base (base plate) 6 which will be described later. The flange 22 is a relay placement portion where the relay 2 is in contact with the bottom portion 61.

As shown in FIG. 1, the relay fixing structure of the embodiment is a structure for fixing the relay 2 to the housing 4. The housing 4 includes the housing base (hereinafter, referred to as the base plate) 6 and the housing cover (hereinafter, referred to simply as the cover) 8. Each of the base plate 6 and the cover 8 is formed by an elastic material (for example, a resin material).

The base plate 6 includes the bottom portion 61 on which the relay 2 is to be placed, and wall portion 62 which surround the outer portions 21 of the relay 2, and which erect from the bottom portion 61. On the bottom portion 61, terminal connecting portions 63 respectively having insertion holes 64 into which terminals (for example, male terminals (not shown)) of the relay 2 are to be inserted erect. In the insertion holes 64, terminals (for example, female terminals (not shown)) 65 which are to be connected to the terminals of the relay 2 are formed. According to the configuration, when the relay 2 is placed on the bottom portion 61 so that the terminals of the relay 2 are inserted into the insertion holes 64 of the terminal connecting portions 63, the terminals of the relay 2 and the terminals 65 of the insertion holes 64 can be electrically connected to each other. FIG. 2 shows the configuration where four terminal connecting portions 63 erect from the bottom portion 61, and four terminals 65 are formed in the insertion holes 64 of the terminal connecting portions 63, respectively. The number of the terminal connecting portions 63 (in brief, the terminals 65) is not limited to this number as far as the number corresponds to the number of the terminals of the relay 2. An arbitrary arrangement may be employed also in the terminal connecting portions 63 (in brief, the terminals 65) as far as the arrangement corresponds to the terminal arrangement of the relay 2.

Four wall portions 62 erect from the bottom portion 61 while being opposed to four outer portions 21 of the relay 2 having a substantially rectangular parallelepiped shape, so as to surround the outer portions 21. Therefore, the base plate 6 has a configuration in which the relay 2 placed on the bottom portion 61 can be accommodated in a space surrounded by the four wall portions 62. As shown in FIG. 3, when the relay 2 is placed on the bottom portion 61, each of the wall portions 62 is opposed to the corresponding one of the outer portions 21 of the flange 22 with forming a gap the size of which is slightly larger than the dimension of the projection of the flange 22 from the outer portion 21. Namely, the wall portions 62 erect from the bottom portion 61 so that the portions can be opposed to the outer portions 21 of the relay 2 with forming the gap. Therefore, the flange 22 is configured so that, in the state where the relay 2 is placed on the bottom portion 61, the flange can interfere with the wall portions 62. When the relay 2 is placed on the bottom portion 61 of the base plate 6, the flange 22 interferes with the wall portions 62, whereby the movement of the relay 2 accommodated in the wall portions 62 (hereinafter, the state where the relay 2 is accommodated in the wall portions 62 is referred to as the positioned state) in a horizontal direction (the front, rear, right, and left directions along the bottom portion 61) can be regulated. In the vicinity of the place where the flange 22 is disposed on the relay 2, i.e., on the side of the bottom portion 61 in the case where the relay is placed on the bottom portion 61 (the lower side in FIG. 1), particularly, the horizontal movement of the relay 2 can be effectively regulated. Reinforcement ribs 66 are adequately disposed on the wall portions 62 so that the rigidity in the case where the relay 2 is accommodated in the wall portions 62 can be improved. The erection height of the wall portions 62 from the bottom portion 61 is set to a height at which the relay 2 can be accommodated in the wall portions 62, and engaging portions 67 which will be described later can be engaged with engaged portions 84.

The cover 8 has a lid portion 81 which is to cover the relay 2, and an edge portion 82 which is suspended from the peripheral edge of the lid portion 81 toward the wall portions 62 of the base plate 6. The lid portion 81 has a substantially rectangular flat plate-like shape which is slightly larger than an upper end portion 23 of the relay 2, and is configured so as to cover the whole of the upper end portion 23. As shown in FIG. 4, reinforcement ribs 83 are disposed in a lattice-like manner on the lid portion 81 so that the rigidity in the case where the lid portion covers the relay 2 is improved.

The edge portion 82 is suspended from the peripheral edge of the lid portion 81 while being opposed to the wall portions 62, so as to be externally inserted onto the wall portions 62 of the base plate 6 which erect from the bottom portion 61 while surrounding the outer portions 21 of the relay 2 having a substantially rectangular parallelepiped shape. When the edge portion 82 is externally inserted onto the wall portions 6, therefore, the cover 8 has the configuration where it covers the relay 2 in the state where the upper end portion 23 of the relay 2 in the positioned state is covered by the lid portion 81.

In the embodiment, the engaging portions 67 which are engaged with the cover 8 are disposed on the base plate 6, and the engaged portions 84 which are engageable with the engaging portions 67 are disposed on the cover 8. As shown in FIGS. 1 and 3, two engaging portions 67 are disposed on each of two wall portions 62 which are opposed to each other in the longitudinal direction (the left and right direction in FIG. 3) of the bottom portion 61, or four engaging portions in total are disposed. In this case, the engaging portions 67 are placed at symmetric positions across the bottom portion 61. Moreover, the engaging portions 67 are formed so as to be projected toward the outer side from the vicinity of upper edge portions of the wall portions 62. The engaging portions 67 have inclined surfaces 68 which are gradually inclined as advancing from the outer side to the inner side, and are configured so as to be tapered as advancing in the erection direction of the wall portions 62 (the upper direction in FIG. 1 and the front direction in FIG. 3, in other words, the direction toward the cover 8). Namely, the engaging portions 67 have the configuration corresponding to a so-called barb. When the engaging portions 67 are to be engaged with the engaged portions 84 which will be described later, therefore, the engaging portions 67 are smoothly guided along the inclined surfaces 68 to the engaged portions 84, whereby they can be easily engaged with each other, and the engaged state can be maintained.

As shown in FIGS. 1 and 4, by contrast, the engaged portions 84 are placed in both end portions in the longitudinal direction (in FIG. 4, the left and right direction) of the lid portion 81 and further outside the edge portion 82. The engaged portions 84 are suspended so as to be opposed to the edge portion 82 with forming a predetermined gap. The engaged portions 84 are elongated flushly with the lid portion 81 and beyond the edge portion 82 in the longitudinal direction, and then downward bent substantially perpendicularly to be suspended. In the engaged portions 84, two openings 85 are formed in each of the bent portions, or four openings 85 in total are placed at symmetric positions across the edge portion 82. The openings 85 may be formed in accordance with the number and arrangement of the engaging portions 67 disposed in the wail portions 62. The opposing distance between the engaged portions 84 and the edge portion 82 may be set so as to be longer than the projection length of the engaging portions 67 from the wall portions 62. According to the configuration, the engaging portions 67 can be inserted into the gaps between the engaged portions 84 and the edge portion 82.

When the cover 8 and the base plate 6 are to be assembled with each other, the positions of the openings 85 of the engaged portions 84 are made correspondent to those of the engaging portions 67, and, while causing the engaged portions 84 to abut against the inclined surfaces 68 of the engaging portions 67, a pressing force is applied to the cover 8 toward the base plate 6 (the lower side in FIG. 1), thereby moving the cover so that the engaged portions 84 are moved along the inclined surfaces 68. In this case, the engaged portions 84 receive the reaction forces opposing the pressing force and from the inclined surfaces 68, to be in a state where the portions are in an elastically flexurally deformed toward the outer side. When the cover 8 is then moved toward the base plate 6 until the engaged portions 84 override the engaging portions 67, the engaged portions 84 are elastically flexurally return deformed. When the engaged portions 84 are elastically flexurally return deformed in this way, a state where the engaging portions 67 are engaged with the lower edges 86 of the openings 85 is formed. As a result, the state where the cover 8 and the base plate 6 are assembled with each other is attained.

As shown in FIG. 4, rib portions 87 which regulate the movement of the relay 2 are disposed on the cover 8. The rib portions 87 have first rib portions 87*a* which abut against the outer portions 21 of the relay 2, and second rib portions 87*b* which abut against the vvaU portions 62 of the base plate 6. The first rib portions 87*a* and the second rib portions 87*b* are formed in plural numbers over the entire circumference of the edge portion 82. Therefore, the rib portions 87 (the first rib portions 87*a* and the second rib portions 87*b*) regulate the movement of the relay 2 in the positioned state in a horizontal direction (the front, rear, right, and left directions along the bottom portion 61).

The first rib portions 87*a* are configured as projection pieces which are projected from the inner circumferential surface 82*a* of the edge portion 82 so as to be substantially perpendicular with the inner circumferential surface 82*a*. FIG. 4 shows an example of the configuration of the first rib portions 87*a* in which, in the inner circumferential surface 82*a*, two projection pieces are symmetrically placed on each of portions that are opposed to each other in the longitudinal direction (the left and right direction in the figure) of the cover 8, and three projection pieces are symmetrically placed on each of portions that are opposed to each other in a direction (the upper and lower direction in the figure) crossing the longitudinal direction. The number of the projection pieces constituting the first rib portions 87*a* is not particularly limited as far as the projection pieces can evenly abut against the four outer portions 21 of the relay 2.

The second rib portions 87*b* are configured as projection pieces which are projected from the outer circumferential surface 82*b* of the edge portion 82 so as to be substantially perpendicular with the outer circumferential surface 82*b*. FIG. 4 shows an example of the configuration of the second rib portions 87*b* in which, in the outer circumferential surface 82*b*, two projection pieces are symmetrically placed on each of portions that are opposed to each other in the longitudinal direction (the left and right direction in the figure) of the cover 8, and two projection pieces are symmetrically placed on each of portions that are opposed to each other in a direction (the upper and lower direction in the figure) crossing the longitudinal direction. The number of the projection pieces constituting the second rib portions 87*b* is not particularly limited as far as the projection pieces can evenly abut against the four wall portions 62 respectively opposed to the four outer portions 21 of the relay 2.

As described above, the first rib portions 87*a* and the second rib portions 87*b* have the configuration where they are projected substantially alternately (in a staggered manner), in order that they are disposed between the two rib portions 87 which are opposed to each other across the edge portion 82. In FIG. 4, in portions (the inner circumferential surface 82*a* and the outer circumferential surface 82*b*) of the edge portion 82 which are opposed to each other in the longitudinal direction (the left and right direction in the figure) of the cover 8, there are portions which do not have the configuration where the first rib portions 87*a* and the second rib portions 87*b* are projected alternately (in a staggered manner) across the edge portion 82. These portions may have the configuration where the rib portions are alternately projected. According to the configuration, in the positioned state of the relay 2, or, in another viewpoint, in the state where the engaging portions 67 are engaged with the engaged portions 84 and the cover 8 and the base plate 6 are engaged with each other, the first rib portions 87*a* abut against the outer portions 21 of the relay 2, and the second rib portions 87*b* abut against the wall portions 62 of the base plate 6. Therefore, the projection lengths of the first rib portions 87*a* and the second rib portions 87*b* from the inner circumferential surface 82*a* and outer circumferential surface 82*b* of the edge portion 82 may be set so that the distance between the projection ends of the first rib portions 87*a* and second rib portions 87*b* which are projected in the opposite directions across the edge portion 82 is substantially equal to the opposing distance between the wall portions 62 and the outer portions 21 of the relay 2 (in another viewpoint, the projection length of the flange 22 of the relay 2). In the case where the projection lengths of the first rib portions 87*a* and the second rib portions 87*h* from the edge portion 82 are set to be substantially equal to each other as shown in FIG. 4, for example, the edge portion 82 is located at an approximate middle of the opposing distance between the wall portions 62 and the outer portions 21 of the relay 2 in the positioned state. When the cover 8 covers the relay 2 in the positioned state, therefore, the first rib portions 87*a* can abut against the outer portions 21 of the relay 2, and the second rib portions 87*b* can abut against the wall portions 62 of the base plate 6, As a result, the movement of the relay 2 in a horizontal direction (the front, rear, right, and left directions along the bottom portion 61) can be regulated. On the side of the upper end portion 23 which is covered by the cover 8, particularly, the horizontal movement of the relay 2 can be effectively regulated.

As shown in FIG. 4, pressing portions 88 which press the relay 2, and which are elastically deformable are disposed on the cover 8. The pressing portions 88 are disposed on the lid portion 81 so as to be opposed to the upper end portion 23 of the relay 2, and, in the state where the engaging portions 67 and the engaged portions 84 are engaged with each other, elastically deformed to press the relay 2 against the bottom portion 61. Therefore, the pressing portions 88 regulate the movement of the relay 2 in the positioned state in the vertical direction (the upper and lower direction with respect to the bottom portion 61).

In this case, two pressing portions 88 are disposed in pair in a substantially central part of the lid portion 81. According to the configuration, the pressing portions 88 can abut against the upper end portion 23 of the relay 2 in the positioned state to evenly press the relay 2 toward the bottom portion 61. In the pair of pressing portions 88, parts which are continuous to the lid portion 81 are formed as basal end parts 88*a*, and plate-like parts 88*b* which are extended from the basal end parts 88*a* toward the outer side in the longitudinal direction (the left and right direction in FIG. 4) of the lid portion 81 are configured so as to be elastically flexurally deformable with respect to the basal end parts 88*a*. In the configuration shown in FIG. 4, cutouts 89 are formed along the peripheral edges of the plate-like parts 88*b*, whereby the plate-like parts 88*h* are caused to have a configuration where the parts are elastically flexurally deformable in the vertical direction with respect to the basal end parts 88*a* which are continuous to the lid portion 81. Namely, the pressing portions 88 are configured so that, while the pair of plate-like parts 88*b* are gradually inclined as advancing toward the upper end portion 23 of the relay 2 in the positioned state, and separate from each other, the pair of plate-like parts 88*b* are projected from the basal end parts 88*a* (in other words, widen while being gradually inclined from the inner side toward the outer side). When a vertical pressing force is applied to the plate-like parts 88*b*, therefore, the plate-like parts 88*b* can be elastically flexurally deformed against the pressing force.

The number, placement positions, shape, and the like of the pressing portions 88 are not limited to the illustrated configuration as far as the relay 2 in the positioned state can be evenly pressed against the bottom portion 61, and may be arbitrarily configured. FIG. 4 shows the exemplary configuration of the pressing portions 88 where the plate-like parts 88*b* are formed into a substantially trapezoidal shape, and their long sides are formed as the basal end parts 88*a*. The plate-like parts may have a substantially semicircular shape, a substantially semi-elliptical shape, or the like. In such a case, cutouts may be formed along the peripheral edges of the plate-like parts, and the diameter parts, long-diameter parts, or short-diameter parts of the plate-like parts are formed as the basal end parts which are continuous to the lid portion 81. Alternatively, another configuration may be employed where e the plate-like parts are extended from the basal end parts toward the inner side in the longitudinal direction (the left and right direction in FIG. 4) of the lid portion 81, and the plate-like parts are elastically flexurally deformable with respect to the basal end parts. In this case, the pressing portions may be configured so that, while the pair of plate-like parts are gradually inclined as advancing toward the upper end portion 23 of the relay 2 in the positioned state, and approach each other, the plate-like parts are projected from the basal end parts (in other words, narrowed while being gradually inclined from the outer side toward the inner side).

In the case where the cover 8 and the base plate 6 are to be assembled with each other, when a pressing force is applied to the cover 8 toward the base plate 6 (the lower side in FIG. 1) while causing the engaged portions 84 to abut against the inclined surfaces 68 of the engaging portions 67, thereby moving the cover so that the engaged portions 84 are moved along the inclined surfaces 68, therefore, the plate-like parts 88*b* of the pressing portions 88 are caused to abut against the upper end portion 23 of the relay 2 in the positioned state.

When the cover 8 is further moved as it is until the engaging portions 67 are engaged with the engaged portions 84, the plate-like parts 88*b* receive the pressing force to form a state where the parts are elastically flexurally deformed in the vertically upward direction (in other words, the direction in which the parts separate from the upper end portion 23 of the relay 2). Then, the engaging portions 67 and the engaged portions 84 are engaged with each other to attain the state where the cover 8 and the base plate 6 are engaged with each other. When the pressing force applied to the cover 8 is released, the plate-like parts 88*b* are elastically flexurally return deformed, and their restoring forces act on the relay 2 via the upper end portion 23 against which the parts abut. As a result, the relay 2 in the positioned state can be pressed against the bottom portion 61 by the restoring forces. At this time, the reaction forces which act from the bottom portion 61 against the restoring forces are applied to the relay 2, and the relay 2 is pressed also against the lid portion 81 of the cover 8 via the plate-like parts 88*b* by the reaction force. Therefore, the relay 2 is in a state where it is clampingly held between the bottom portion 61 of the base plate 6 and the lid portion 81 of the cover 8, i.e., a state where the relay is sandwiched from the both sides in the vertical direction. Consequently, the movement of the relay 2 in the vertical direction (the upper and lower direction with respect to the bottom portion 61) can be effectively regulated.

In the relay fixing structure of the embodiment, as described above, the relay 2 can be easily assembled to the housing 4, simply by setting the relay 2 to be in the positioned state, and attaching the cover 8 which covers the relay 2 in the state, to the base plate 6. Namely, the assembly property of the relay 2 with respect to the housing can be improved. In the assembled state, the movements of the relay 2 in all of the upper, lower, front, rear, right, and left directions (namely, the horizontal and vertical directions) of the housing 4 can be regulated. In the relay fixing structure of the embodiment, on the side of the upper end portion 23 which is covered by the cover 8, the movement of the relay 2 in the horizontal direction (the front, rear, right, and left directions along the bottom portion 61) can be effectively regulated by the rib portions 87 (the first rib portions 87*a* and the second rib portions 87*b*). Moreover, the movement of the relay 2 in the vertical direction (the upper and lower direction with respect to the bottom portion 61) can be effectively regulated in the state where the relay is sandwiched from the both sides in the vertical direction by the pressing forces (restoring forces due to elastic flexural return deformation) of the pressing portions 88 which act on the upper end portion 23. Therefore, even in the case where the relay 2 in which the center of gravity is in an upper part is to be fixed, for example, shaking or rattling of the relay 2 due to vibration of the vehicle can be surely suppressed. Also in this case, the horizontal movement of the relay 2 can be effectively regulated by the flange 22 on the side where the relay 2 is placed on the bottom portion 61.

Features of the above-described embodiment of the relay fixing structure of the invention are listed in [1] and [2] below in a brief and summarized manne

[1]The relay fixing structure for fixing the relay (2) which controls the on/off states of the electric circuit, to the housing (6) comprising:

the housing base (6) including the bottom portion (61) on which the relay is to be placed, and the wall portion (62) which surrounds the outer portion (21) of the relay and erects from the bottom portion; and the housing cover including the lid portion (81) which covers the relay, and the edge portion (82) which is suspended from the peripheral edge of the lid portion toward the wall portion of the housing base, wherein the housing base is provided with the engaging portion (67) which is engaged with the housing cover, the housing cover is provided with the engaged portion (84) which is configured to be engaged with the engaging portion, the rib portion (87) vvhich regulates movement of the relay, and the pressing portion (88) which presses the relay and is elastically deformable, the rib portion includes the first rib portions (87*a*) which abut against the outer portion, and the second rib portions (87*b*) which abut against the wall portion, the first rib portions and the second rib portions are formed in plural numbers over an entire circumference of the edge portion, and the pressing portion is disposed on the lid portion so as to be opposed to the relay, and is elastically deformed to press the relay toward the bottom portion in the state where the engaging portions and the engaged portions are engaged with each other. [2] The relay fixing structure of [1] above, wherein the relay includes the flange (22) which is formed over the entire circumference by being projected from the outer portion located on the side of the bottom portion in the case where the relay is placed on the bottom portion, and, the flange interferes with the wall portion in the state where the relay is placed on the bottom portion.

Although the invention has been described in detail and with reference to the specific embodiment, it is obvious to a person skilled in the art that various changes and modifications can be made without departing from the spirit and scope of the invention.

The application is based on Japanese Patent Application (No. 2012-242228) filed Nov. 1, 2012, and its disclosure is incorporated herein by reference.

INDUSTRIAL APPLICABILITY

According to the relay fixing structure of the invention, the relay can be easily assembled to the housing, and movements of the relay in all of the upper, lower, front, rear, right, and left directions can be regulated. The invention which achieves the effects is useful in the field of a structure for fixing a relay to a housing.

REFERENCE SIGNS LIST

2 relay
6 housing base (base plate)
8 housing cover (cover)
21 outer portion
61 bottom portion
62 wall portion
67 engaging portion
81 lid portion
82 edge portion
84 engaged portion
87 rib portion
87*a* first rib portion
87*b* second rib portion
88 pressing portion

The invention claimed is:

1. A relay fixing structure for fixing a relay which controls on/off states of an electric circuit, to a housing, comprising:

a housing base including a bottom portion on which the relay is to be placed, and a wall portion which surrounds an outer portion of the relay and erects from the bottom portion; and a housing cover including a lid portion which covers the relay, and an edge portion which is suspended from a peripheral edge of the lid portion toward the wall portion of the housing base, wherein the housing base is provided with an engaging portion which is engaged with the housing cover, the housing cover is provided with an engaged portion which is configured to be engaged with the engaging portion, a rib portion which regulates movement of the relay, and a pressing portion which presses the relay and is elastically deformable, the rib portion includes first rib portions which abut against the outer portion, and second rib portions which abut against the wall portion, the first rib portions and the second rib portions are formed in plural numbers over an entire circumference of the edge portion, and the pressing portion is disposed on the lid portion so as to be opposed to the relay, and is elastically deformed to press the relay toward the bottom portion in a state where the engaging portion and the engaged portion are engaged with each other.

2. The reay fixing structure according to claim 1, wherein the relay includes a flange which is formed over an entire circumference by being projected from the outer portion located on a side of the bottom portion in a case where the relay is placed on the bottom portion, and the flange interferes with the wall portion in a state where the relay is placed on the bottom portion.

* * * * *